United States Patent
English et al.

(10) Patent No.: US 11,201,767 B1
(45) Date of Patent: Dec. 14, 2021

(54) CONTINUOUS TIME LINEAR EQUALIZATION INCLUDING A LOW FREQUENCY EQUALIZATION CIRCUIT WHICH MAINTAINS DC GAIN

(71) Applicant: International Business Machines Corporation, Armonk, NY (US)

(72) Inventors: Erik English, Beacon, NY (US); Chad Andrew Marquart, Austin, TX (US); Pier Andrea Francese, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/330,937

(22) Filed: May 26, 2021

(51) Int. Cl.
*H03L 7/08* (2006.01)
*H04L 25/03* (2006.01)

(52) U.S. Cl.
CPC ...... *H04L 25/03878* (2013.01); *H03L 7/0807* (2013.01)

(58) Field of Classification Search
CPC ......... H04L 25/03057; H04L 25/03885; H04L 1/0041; H04L 7/0025; H04L 25/03878; H04L 1/0045; H04L 1/0061; H04L 1/0057; H04L 7/033; H04L 25/0272; H04L 25/49; H04L 2025/0349; G06F 2213/0026; G06F 13/4068; G06F 13/405; G06F 13/4072; G06F 13/20; G06F 13/4027; G06F 13/4221; G06F 13/4265; G06F 13/4282; G06F 13/4291; G06F 11/0772; G06F 11/273; H03L 7/0807; H03L 7/093; H03L 7/0998; H03L 2207/06; H03L 7/00; H03L 7/087; H03L 7/0891; H03L 7/0995; H03L 7/0996; H03L 7/23; H03L 7/07; H03L 7/081; H03L 7/0814; H03L 7/099
USPC .................................................. 375/230, 233
See application file for complete search history.

(56) References Cited

U.S. PATENT DOCUMENTS

| | | | |
|---|---|---|---|
| 8,937,990 B2 | 1/2015 | Hidaka | |
| 9,288,085 B2 | 3/2016 | Bulzacchelli et al. | |
| 9,397,623 B1 | 7/2016 | Lacroix | |
| 9,473,330 B1 | 10/2016 | Francese | |
| 9,577,607 B1 | 2/2017 | Francese et al. | |
| 10,075,141 B1 | 9/2018 | Nagulapalli et al. | |
| 10,116,470 B2 | 10/2018 | Gu et al. | |

(Continued)

FOREIGN PATENT DOCUMENTS

CN 104660227 B 4/2017

OTHER PUBLICATIONS

Grace Period Disclosure. You, "A 25-50Gb/s 2.22pJ/b NRZ RX with Dual-Bank and 3-tap Speculative DFE for Microprocessor Application in 7nm FinFET CMOS"; Jun. 2020 IEEE Xplore. 2 pages.

*Primary Examiner* — Eva Y Puente
(74) *Attorney, Agent, or Firm* — Cantor Colburn LLP; Margaret McNamara

(57) ABSTRACT

Embodiments are directed to continuous time linear equalization including a low frequency equalization circuit which maintains DC gain. A first all-pass filter is coupled to an integrated filter, the integrated filter having a low-pass filter and a second all-pass filter. A high-pass filter is coupled to the first all-pass filter and the integrated filter, a differential input terminal being coupled to the first all-pass filter, the integrated filter, and the high-pass filter, where a differential output terminal is coupled to the high-pass filter.

20 Claims, 11 Drawing Sheets

(56) References Cited

U.S. PATENT DOCUMENTS

| | | |
|---|---|---|
| 10,243,531 B1 | 3/2019 | Thiagarajan et al. |
| 10,263,811 B2 | 4/2019 | Norimatsu |
| 10,341,145 B2 | 7/2019 | Musah et al. |
| 10,397,027 B2 | 8/2019 | Francese et al. |
| 2006/0182171 A1 | 8/2006 | Kuijk et al. |
| 2015/0078430 A1 | 3/2015 | Lee et al. |
| 2016/0173299 A1* | 6/2016 | Islam .................. H04L 25/0296 375/233 |
| 2019/0097845 A1* | 3/2019 | Francese ............. H03F 3/45179 |
| 2020/0036563 A1* | 1/2020 | Talbot ................... H02H 9/045 |
| 2021/0151091 A1* | 5/2021 | Jeon ..................... G11C 7/1093 |
| 2021/0152404 A1* | 5/2021 | Levin ................ H04L 25/03878 |

\* cited by examiner

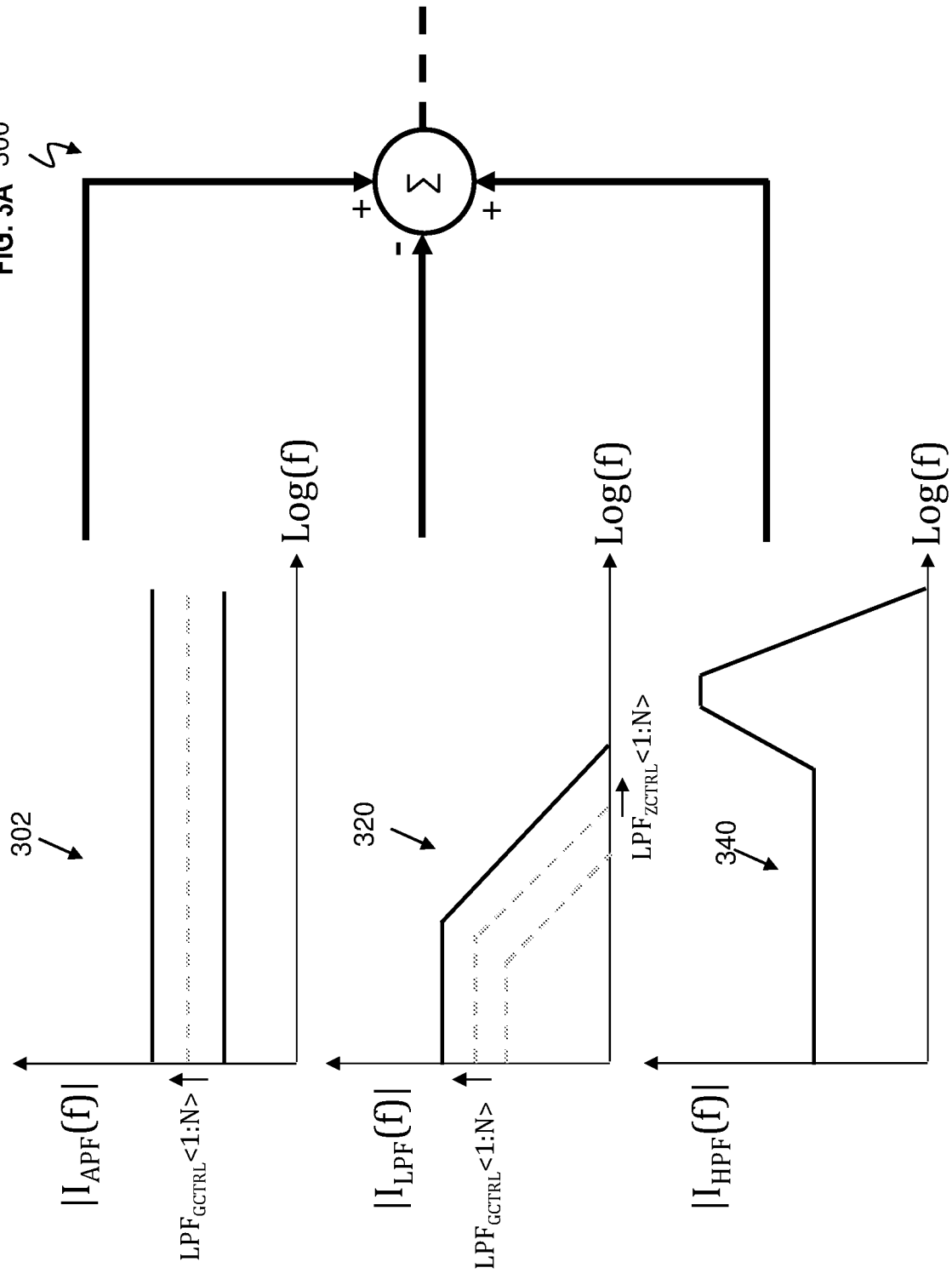

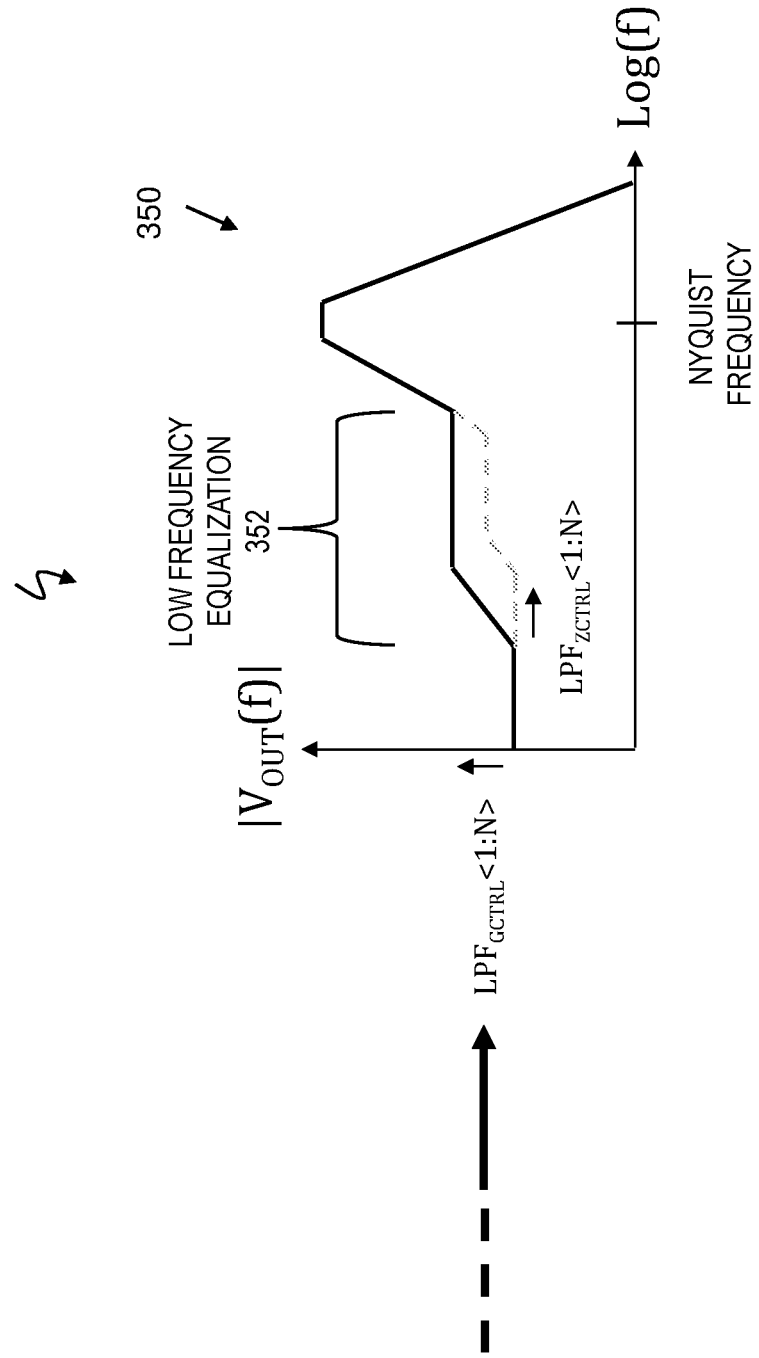
FIG. 3B  300 (CONTINUED)

COUPLE AN ALL-PASS FILTER TO AN INTEGRATED FILTER, THE INTEGRATED FILTER COMPRISING A LOW-PASS FILTER AND ANOTHER ALL-PASS FILTER 602

COUPLE A HIGH-PASS FILTER TO THE ALL-PASS FILTER AND THE INTEGRATED FILTER, A DIFFERENTIAL INPUT TERMINAL BEING COUPLED TO THE ALL-PASS FILTER, THE INTEGRATED FILTER, AND THE HIGH-PASS FILTER, WHEREIN A DIFFERENTIAL OUTPUT TERMINAL IS COUPLED TO THE HIGH-PASS FILTER 604

CONFIGURE A FIRST INTEGRATED FILTER CIRCUIT COMPRISING A LOW-PASS FILTER COUPLED TO AN ALL-PASS FILTER  702

CONFIGURE A SECOND INTEGRATED FILTER CIRCUIT COMPRISING A HIGH-PASS FILTER COUPLED TO ANOTHER ALL-PASS FILTER, THE FIRST INTEGRATED FILTER CIRCUIT BEING COUPLED TO THE SECOND INTEGRATED FILTER CIRCUIT, A DIFFERENTIAL INPUT TERMINAL BEING COUPLED TO THE FIRST INTEGRATED FILTER CIRCUIT AND THE SECOND INTEGRATED FILTER CIRCUIT, WHEREIN A DIFFERENTIAL OUTPUT TERMINAL IS COUPLED TO THE SECOND INTEGRATED FILTER CIRCUIT  704

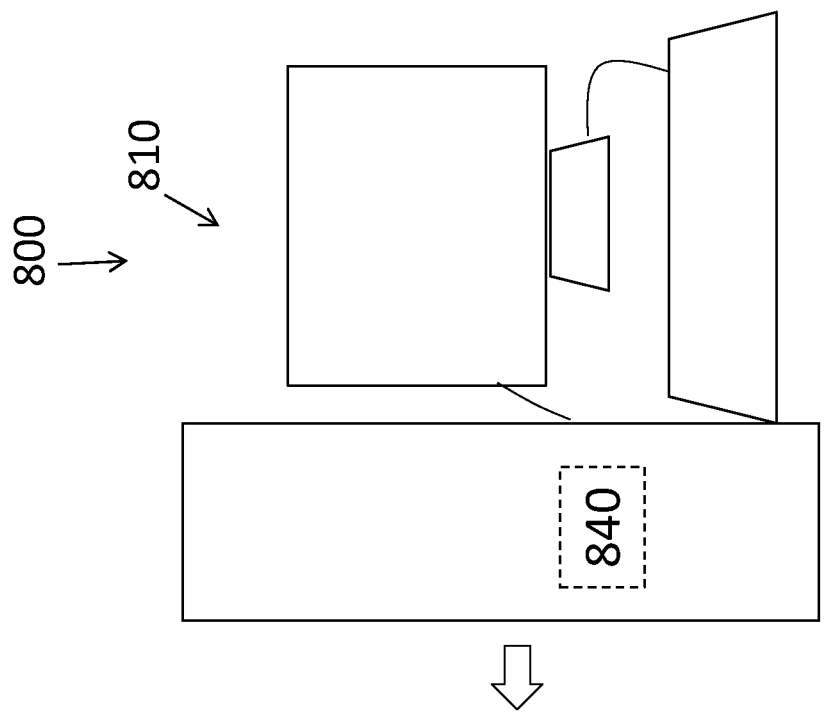
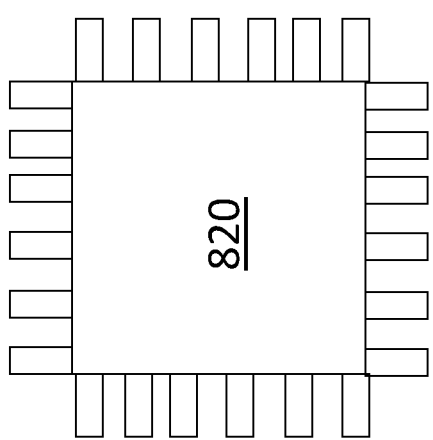
FIG. 8A

CONTINUOUS TIME LINEAR EQUALIZATION INCLUDING A LOW FREQUENCY EQUALIZATION CIRCUIT WHICH MAINTAINS DC GAIN

STATEMENT REGARDING PRIOR DISCLOSURES BY THE INVENTOR OR A JOINT INVENTOR

The following disclosures are submitted under 35 U.S.C. 102(b)(1)(A): DISCLOSURES: "A 25-50 Gb/s 2.22 pJ/b NRZ RX with Dual-Bank and 3-tap Speculative DFE for Microprocessor Application in 7 nm FinFET CMOS," by Yang You et al., June 2020, 2 pages.

BACKGROUND

The present invention generally relates to computer systems, and more specifically, to computer-implemented methods, computer systems, and computer program products configured and arranged for providing continuous time linear equalization including a low frequency equalization circuit which maintains DC gain.

Data transmission systems for high-speed communication are subject to signal distortion of the transmitted signal. Various measures are applied to reconstruct the transmitted data from the received analog signal. In receiving units, a number of equalizers are commonly provided to compensate for losses and signal distortion substantially caused by propagating the data signal via the transmission channel. One known measure concerns an equalization of the received analog signal in the continuous time regime, i.e., before sampling and digitization, by means of a continuous time linear equalizer. The received analog signal to be processed by the continuous time linear equalizer corresponds to a continuous voltage or current signal which is transmitted across the physical transmission channel according to a digital modulation format, for example, to non-return-to-zero binary level signaling or to a pulse amplitude modulation. It is the general purpose of continuous time linear equalization to compensate for the losses of high-frequency components of the transmitted analog signal which are caused by attenuation and dispersion of the signal propagating along the transmission channel. Continuous time linear equalizers are used in the receiving units in order to equalize the transmission channel attenuation up to a peaking frequency by means of a high-pass transfer function. Generally, continuous time linear equalizers use active peaking transistor arrays followed by integrating summers to achieve an equalization for high-speed data transmission systems.

SUMMARY

Embodiments of the present invention are directed to methods for providing continuous time linear equalization including a low frequency equalization circuit which maintains DC gain. A non-limiting example method includes coupling a first all-pass filter to an integrated filter, the integrated filter including a low-pass filter and s second all-pass filter. Also, the method includes coupling a high-pass filter to the first all-pass filter and the integrated filter, a differential input terminal being coupled to the first all-pass filter, the integrated filter, and the high-pass filter, wherein a differential output terminal is coupled to the high-pass filter.

A non-limiting example method includes configuring a first integrated filter circuit comprising a low-pass filter coupled to a first all-pass filter. The method includes configuring a second integrated filter circuit comprising a high-pass filter coupled to a second all-pass filter, the first integrated filter circuit being coupled to the second integrated filter circuit. A differential input terminal is coupled to the first integrated filter circuit and the second integrated filter circuit, where a differential output terminal is coupled to the second integrated filter circuit.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 3A and 3B depict a block diagram of graphical representations for the filter responses and the output response of a continuous time linear equalizer/equalization circuit in accordance with one or more embodiments of the present invention;

FIG. 6 depicts a flowchart of a method for continuous time linear equalization that maintains the direct current level in accordance with one or more embodiments;

FIG. 7 depicts a flowchart of a method for continuous time linear equalization that maintains the direct current level in accordance with one or more embodiments;

FIG. 8A is a block diagram of a system to form an integrated circuit for the continuous time linear equalization circuit in accordance with one or more embodiments of the present invention.

DETAILED DESCRIPTION

One or more embodiments of the present invention provide computer-implemented methods, computer systems, and computer program products arranged and configured for providing continuous time linear equalization including a low frequency equalization circuit which maintains direct current (DC) gain. In the continuous time linear equalizer, input is fed through a low-pass filter with a configurable DC gain to produce an output that is subtracted from the summation of the outputs of an all-pass filter configured with the same DC gain and a high-pass filter, thereby implementing a desired high-frequency equalization function.

Figure 1:
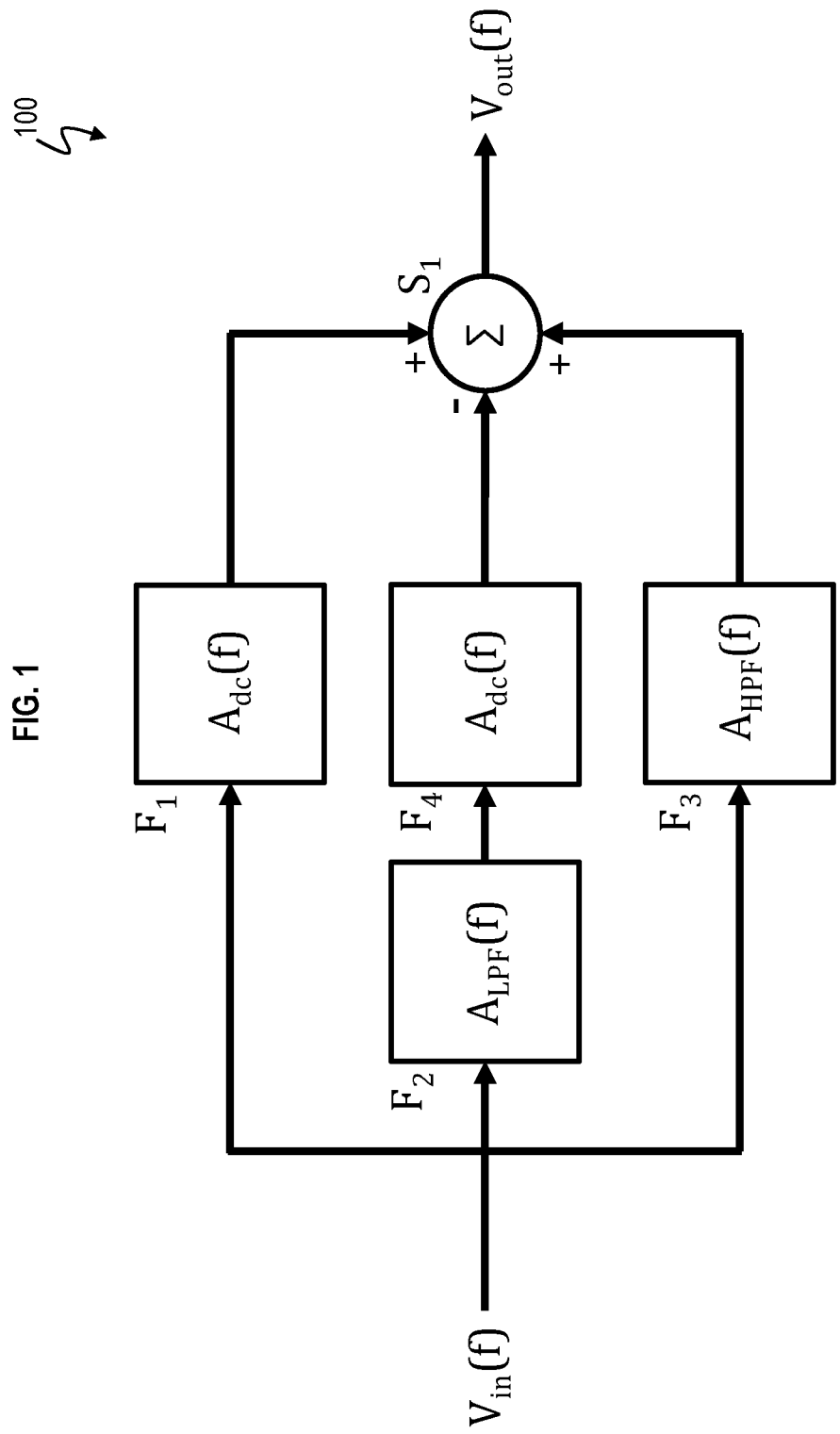
FIG. 1 depicts a high-level block diagram of a system in accordance with one or more embodiments of the present invention.

FIG. 1 is a high-level block diagram of a system 100 in accordance with one or more embodiments of the invention. System 100 depicts a continuous time linear equalizer circuit including a configurable low frequency equalization circuit which maintains DC gain. In FIG. 1, an unequalized signal Vin(f) is fed through a low-pass filter F2 with a configurable DC gain to produce an output that is subtracted from the summation of the outputs of an all pass-filter F1 configured with the same DC gain and a high-pass filter F3 implementing a desired high-frequency equalization function. Vin(f) represents the differential input signal Vin and Vip, where Vin is the negative input signal and Vip is the positive input signal.

The result of the summation is $V_{OUT}(f)$, which represents the differential output voltage. By including the all-pass filter F1 with a matched DC gain, the DC gain of the equalizer circuit is maintained independent of the magnitude of the low-frequency equalization applied to the signal via the combination of low-pass filter F2 and all pass filters F1, F4. The magnitude of the low-frequency equalization applied is easily adjustable by changing the DC gain of all-pass filters F1, F4. Adjustment of the low-frequency equalization frequency band is achieved through the use of configurable capacitors setting the corner frequency of the low-pass filter F2.

Figure 2A:
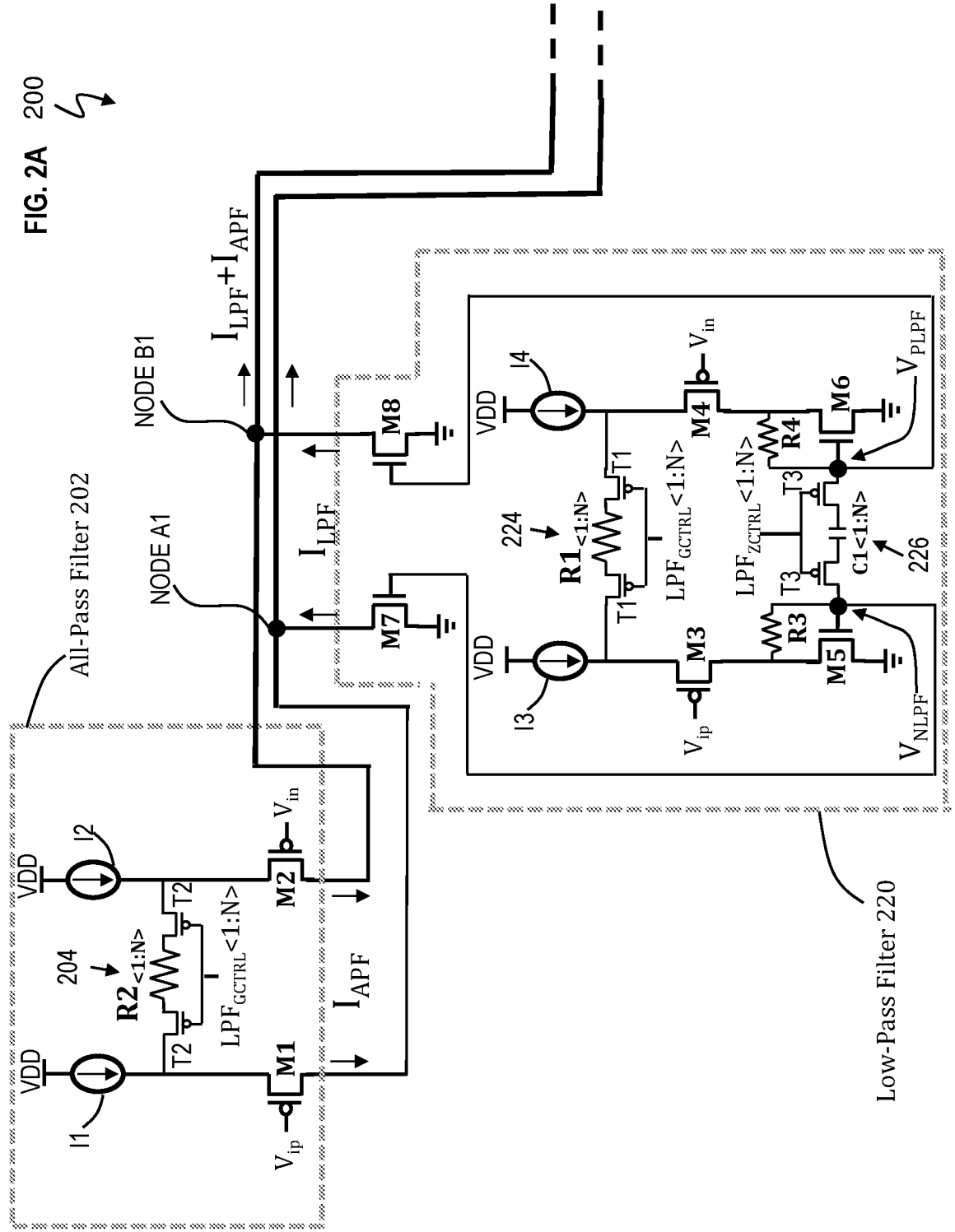
FIGS. 2A and 2B depict a schematic diagram of a continuous time linear equalizer/equalization circuit in accordance with one or more embodiments of the present invention.
Figure 2B:
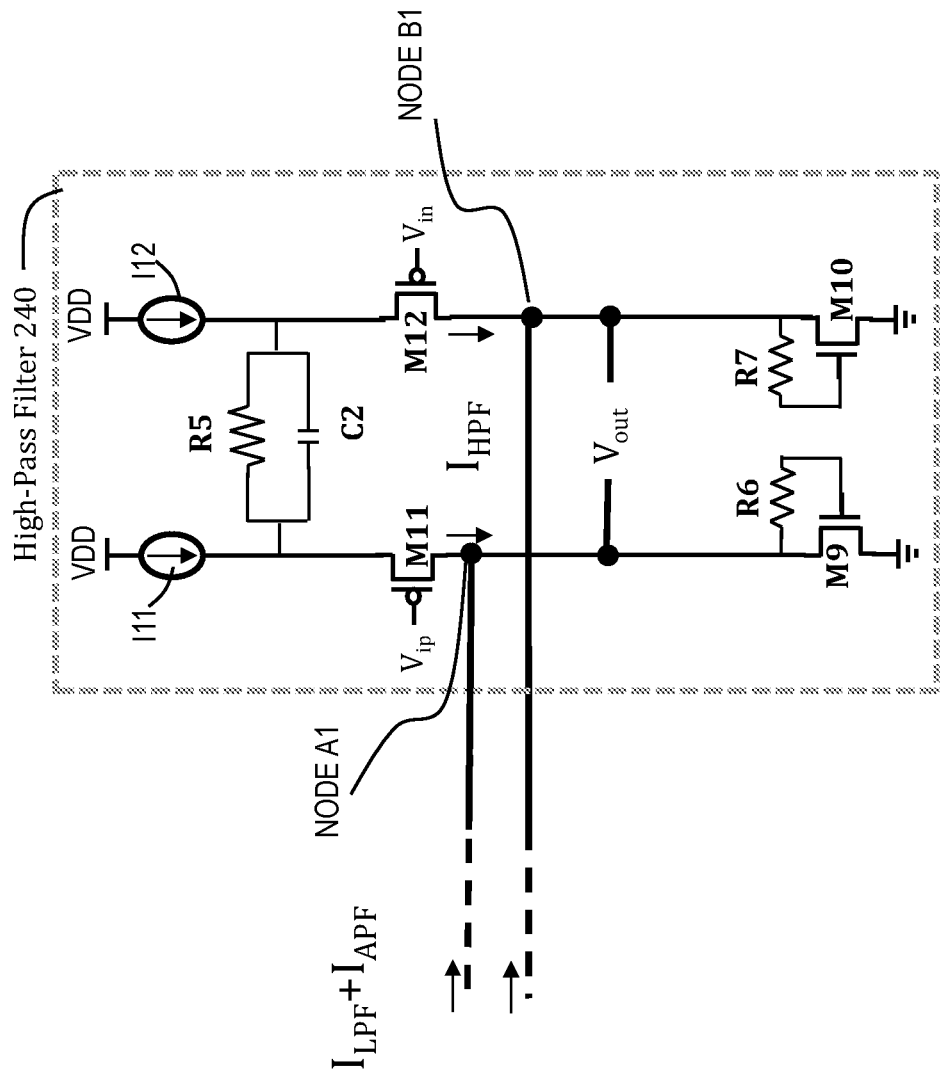

FIGS. 2A and 2B together depict a schematic diagram of a continuous time linear equalizer/equalization circuit 200 in accordance with one or more embodiments of the invention. Circuit 200 includes all-pass filter 202, low-pass filter 220, and high-pass filter 240. The features of system 100 are encompassed in circuit 200. For example, all-pass filter 202 corresponds to all pass-filter F1. Low-pass filter 220 is a combination circuit that includes both low-pass filter F2 and all-pass filter F4. High-pass filter 240 corresponds to high-pass filter F3.

All-pass filter 202 includes current source I1 coupled to transistor M1 and current source I2 coupled to transistor M2. Current sources I1 and I2 are coupled to supply voltage such as, for example, VDD. Transistors M1 and M2 can p-type metal-oxide-semiconductor field-effect transistors (MOSFETs) which are PMOS transistors or PFETs. A configurable device 204 is connected at the outputs of current sources I1 and I2 and includes an array of resistors R2<1:N> having each opposite end of their terminals coupled to transistor array T2<1:N>. The transistors T2<1:N> can be PMOS transistors. The effective resistance of R2 varies according to a digital control signal designated as $LPF_{GCTRL}<1:N>$ that is input to gates of the transistors T2<1:N>. Changing the value of the control signal $LPF_{GCTRL}<1:N>$ turns on or off transistors in array T2<1:N> which varies the number of resistors that are connected in parallel thereby increasing or decreasing the effective resistance of configurable resistance of configurable device 204. Current $I_{APF}$ from each of the drains of transistors M1 and M2 is output to node A1 and node B1.

Low-pass filter 220 includes a combination of an all-pass filter circuit and low-pass filter circuit and may be referred to as a combinational low-pass filter and all-pass filter or integrated low-pass filter and all-pass filter. The all-pass filter within low-pass filter 220 is analogous to the all-pass filter 202. The all-pass filter circuit inside low-pass filter 220 includes current source I3 coupled to transistor M3 and current source I4 coupled to transistor M4. Transistors M3 and M4 can PMOS transistors. Current sources I3 and I4 are matched to current sources I1 and I2. A configurable device 224 is connected at the outputs of current sources I3 and I4 and includes a configurable resistor R1 having each opposite end of its terminals coupled to a transistor T1. The two transistors T1 can be PMOS transistors. The resistance of resistor R1 varies according to a control signal designated as $LPF_{GCTRL}<1:N>$ that is input to gates of the two transistors T1. It should be appreciated that the all-pass filter inside low-pass filter 220 is identical to elements of the all-pass filter 202. Current from each of the drains of transistors M3 and M4 is output to the low-pass filter part of low-pass filter 220.

The low-pass filter circuit of low-pass filter 220 includes transistor M5, transistor M6, transistor M7 and transistor M8. Transistor M5 has its drain coupled to the drain of transistor M3 and to resistor R3, and the opposite terminal of R3 is coupled to the gate of transistor M5. Transistor M6 has its drain coupled to the drain of transistor M4 and to resistor R4, and the opposite terminal of R4 is coupled to the gate of transistor M6. A configurable device 226 is connected to the gates of transistors M5 and M6 and includes a configurable capacitor array C1<1:N> having each opposite end of its terminals coupled to transistor array T3<1:N>. The capacitance of capacitor C1 varies according to a digital control signal designated as $LPF_{ZCTRL}<1:N>$ that is input to gates of the transistors T3<1:N>. Changing the value of the control signal $LPF_{ZCTRL}<1:N>$ turns on or off transistors in transistor array T3<1:N> which varies the number of capacitors that are connected in parallel thereby increasing or decreasing the effective capacitance of configurable capacitor device 226. The transistors T1, T3, M5, and M6 can be PMOS transistor. The gate of transistor M5 is coupled to the gate of transistor M7, and the drain of transistor M7 is coupled to node A1. Similarly, the gate of transistor M6 is coupled to the gate of transistor M8, and the drain of transistor M8 is coupled to node B1. Transistors M7 and M8 can be n-type MOSFETs which are NMOS transistors or NFETs. Current $I_{LPF}$ from each of the drains of transistors M7 and M8 is output to node A1 and B1.

A high-pass filter 240 includes current source I11 coupled to transistor M11 and current source I12 coupled to transistor M12. Transistors M11 and M12 can PMOS transistors. Resistor R5 and capacitor C2 are connected in parallel, one terminal of both resistor R5 and capacitor C2 is coupled to the output of current source I11 as well as the source of transistor M11, and the other terminal of both resistor R5 and capacitor C2 is coupled to the output of current source I12 as well as the source of transistor M12. The drain of transistor M9 is coupled to the drain of transistor M11 and one terminal of resistor R6. The other end of transistor R6 is coupled to the gate of transistor M9. Similarly, a drain of transistor M10 is coupled to the drain of transistor M12 and one terminal of resistor R7. The other end of transistor R7 is coupled to the gate of transistor M10. Transistors M9 and M10 can be NMOS transistors. Current $I_{HPF}$ from each of the drains of transistors M11 and M12 is output to node A1 and B1.

As can be seen in circuit 200, all-pass filter 202, low-pass filter 220, and high-pass filter 240 are coupled together at node A1 and node B1, which correspond to differential output $V_{OUT}$. Further details regarding the operation of circuit 200 are now discussed, which are analogous to the discussion of FIG. 1.

The circuit of low-pass filter 220 converts an input differential voltage (Vip−Vin) to an output differential voltage (VPLPF−VPLPF). A positive differential voltage applied to the gates of the input PFET pair M3 and M4 generates a differential current which is converted to differential voltage (VPLPF−VNLPF) by the diode connected NFETs M5 and M6. The magnitude of the differential current and therefore voltage generated on ($V_{PLPF}$−$V_{NLPF}$) (i.e., the DC gain of low-pass filter 220) is set by resistor R1 which is a configurable resistance set by the control bus $LPF_{GTRL}$<1:N>. Increasing the value of resistor R1 decreases the DC gain of low-pass filter 220. The voltages $V_{PLPF}$ and $V_{NLPF}$ are connected to the gates of NFET transistors M7 and M8 in a current mirroring configuration such that a differential current $I_{LPF}$ is generated. If the dimensions of NFET transistors M5, M6, M7, and M8 match, then the differential current $I_{LPF}$ is equal in magnitude and opposite in polarity to the magnitude of differential current generated by the input pair of the low-pass filter stage (PFETs M3 and M4). The resistors R3 and R4 and the configurable capacitor C1 form a low-pass filter which has an adjustable pole frequency set by the control bus $LPF_{ZCTRL}$<1:N> to the gates of transistors T3. For the purposes of this disclosure, this pole frequency would be set substantially below the Nyquist rate and so considered low frequency. At frequencies higher than the pole frequency (i.e., which are considered high frequencies), the differential voltage developed on ($V_{PLPF}$−$V_{NLPF}$) will drop to 0. A change on the differential input ($V_{ip}$−$V_{in}$) to low-pass filter 220 no longer results in any change in the output (VPLPF−VNLPF). This in turn causes the magnitude of the mirrored current $I_{LPF}$ to also drop to 0 for high frequencies.

The circuit of all-pass filter 202 converts an input differential voltage (Vip−Vin) to an output differential current $I_{APF}$ which is summed with the output current ($I_{LPF}$) of low-pass filter 220. The magnitude of the differential current $I_{APF}$ is set by resistor R2 which is a configurable resistance set by the control bus $LPF_{GTRL}$<1:N>. If the input PFET pair M1 and M2 and resistor R1 of all-pass filter 202 are matched to PFET pair M3 and M4 and resistor R2 in low-pass filter 220, then at frequencies below the pole frequency of the LPF (low-pass filter) the current $I_{APF}$ will be exactly equal in magnitude but opposite in polarity to current $I_{LPF}$. Therefore, the sum of $I_{LPF}$ and $I_{APF}$ will be zero at low frequency. However, above the pole frequency, the LPF current $I_{LPF}$ drops to zero (i.e., in the case of high frequency which is above the pole frequency), and therefore, the sum of $I_{LPF}$ $I_{APF}$ is equal to (only) $I_{APF}$ at high frequency.

The circuit of high-pass filter 240 may use a standard continuous time linear equalization topology. In high-pass filter 240, the input PFET pair M11 and M12 convert a differential input voltage ($V_{ip}$−$V_{in}$) to a differential current $I_{HPF}$. The differential current $I_{HPF}$ is summed with $I_{APF}$ and $I_{LPF}$ and converted to a differential voltage $V_{OUT}$ by means of the diode connected NFETs M9 and M10. Since the sum of currents $I_{LPF}$ and $I_{APF}$ is zero below the pole frequency of the low-pass filter 220 (i.e., low frequency), the response of $V_{OUT}$ below this frequency (i.e., the DC gain of the circuit) is completely unchanged by the inclusion of the circuits of low-pass filter 220 and all-pass filter 202 and is set (only) by the components of high-pass filter 240 (i.e., the response is set only by NFETs M9, M10 and $I_{HPF}$). After/above the pole frequency of low-pass filter 220 (i.e., high frequency), the summation of $I_{LPF}$+$I_{APF}$=$I_{APF}$ such that current $I_{APF}$ from all-pass filter 202 is added to the HPF (high-pass filter) current $I_{HPF}$ for high frequencies, because current $I_{LPF}$ is zero above the pole frequency. Accordingly, this leads to an increase in the gain at frequencies higher than the pole frequency of low-pass filter 220. The magnitude of the increase in gain is controllable by $LPF_{GTRL}$<1:N> and the frequency at which it occurs is set by $LPF_{ZTRL}$<1:N> as described previously.

The combination of the high-pass filter 240, low-pass filter 220, and all-pass filter 202 circuits therefore implements an equalizer with a configurable low frequency gain boost (i.e., an increase in gain/equalization at some frequency above DC but substantially below the Nyquist rate) which does not reduce the DC gain.

Figure 4:
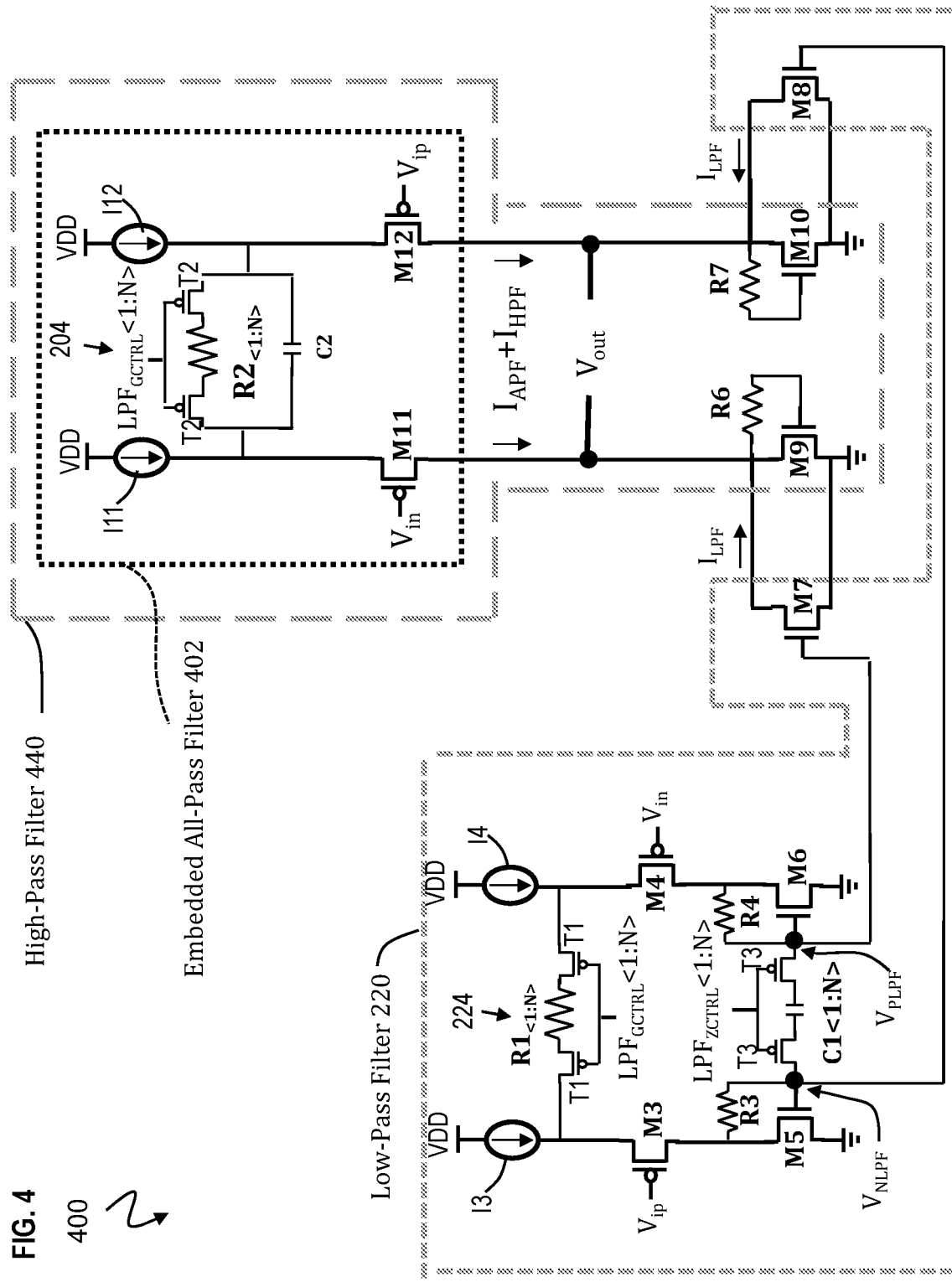
FIG. 4 depicts a schematic diagram of a continuous time linear equalizer/equalization circuit in accordance with one or more embodiments of the present invention.

FIGS. 3A and 3B depict a block diagram 300 of graphical representations of the filter responses and the output response of circuit 200, as well as circuit 400 in FIG. 4, in accordance with one or more embodiments. Graphical response 302, graphical response 320, and graphical response 340 are input to a summer (summation element) resulting in the output graph 350. Graphical responses 302, 320, 340 are graphs of current versus frequency. The graphical response 302 is for the all-pass filter such as all-pass filter 202 in FIGS. 2A and 2B and all-pass filter 440 in FIG. 4. The magnitude of current $I_{APF}$ can be adjusted according to the control signal $LPF_{GCTRL}$<1:N>. The graphical response 320 is for the low-pass filter such as low-pass filter 220 in FIGS. 2A, 2B, and 4. The magnitude of current $I_{LPF}$ can be adjusted according to the control signal $LPF_{GCTRL}$<1:N>, while the frequency is shifted according to the control signal $LPF_{ZCTRL}$<1:N>. Increasing control signal $LPF_{GCTRL}$<1:N> increases both currents $I_{LPF}$ and $I_{APF}$ in tandem, and likewise, decreasing control signal $LPF_{GCTRL}$<1:N> decreases both currents $I_{LPF}$ and $I_{APF}$ in tandem. Increasing control signal $LPF_{ZCTRL}$<1:N> increases the zero frequency of the low-pass filter shifting the pole frequency further to the right, and likewise, decreasing control signal $LPF_{ZCTRL}$<1:N> decreases the zero frequency of the low-pass filter shifting the pole frequency further to the left. The graphical response 340 is for the high-pass filter such as high-pass filter 240 in FIGS. 2A and 2B and high-pass filter 440 in FIG. 4.

Output graph 350 is a graph of voltage $V_{OUT}$ versus frequency after summing graphical responses 302, 320, 340. As seen in the output graph 350, the output response shows a low frequency gain 352 which is the low frequency equalization discussed herein. The magnitude of the low frequency gain 352 can be shifted according to the control signal $LPF_{GCTRL}$<1:N>. The frequency of the low frequency gain 352 can be shifted according to the control signal $LPF_{ZCTRL}$<1:N>. Accordingly, circuits 200, 400 provide low frequency equalization with control to change the magnitude of output voltage $V_{OUT}$ and position (in frequency) for the low frequency gain 352.

FIG. 4 depicts a schematic diagram of a continuous time linear equalizer/equalization circuit 400 in accordance with one or more embodiments of the invention. Circuit 400 includes embedded all-pass filter 402, low-pass filter 220, and high-pass filter 440. Circuit 400 is analogous to circuit 200. The functionality of circuit 400 in FIG. 4 (exactly) matches the description for circuit 200 in FIGS. 2A and 2B. Particularly, devices M3, M4, M5, M6, M7, M8, R1, R3, R4 and C1 in FIG. 4 are identical in purpose and function to devices M3, M4, M5, M6, M7, M8, R1, R3, R4 and C1 of FIGS. 2A and 2B. The function of low-pass filter 220 circuit and generation of current $I_{LPF}$ is identical to the description of FIGS. 2A and 2B.

To simplify the circuit of FIGS. 2A and 2B, the all-pass filter 402 circuit can be folded into the high-pass filter 440 circuit as shown in FIG. 4, and this is accomplished by scaling up the dimensions of transistors M11 and M12, the biasing current $I_{HPF}$ of the high-pass filter 402, and scaling down the resistor R2. It is noted that consideration should be given to set the configurable resistor R2 correctly to maintain that current $I_{LPF}$ and current $I_{APF}$ are equal and opposite in magnitude. If set correctly, the circuit 400 functionality remains identical to that of circuit 200 in FIGS. 2A and 2B, but the layout design is made simpler reducing parasitic wiring resistance and capacitance, thereby improving the circuit performance.

Figure 5:
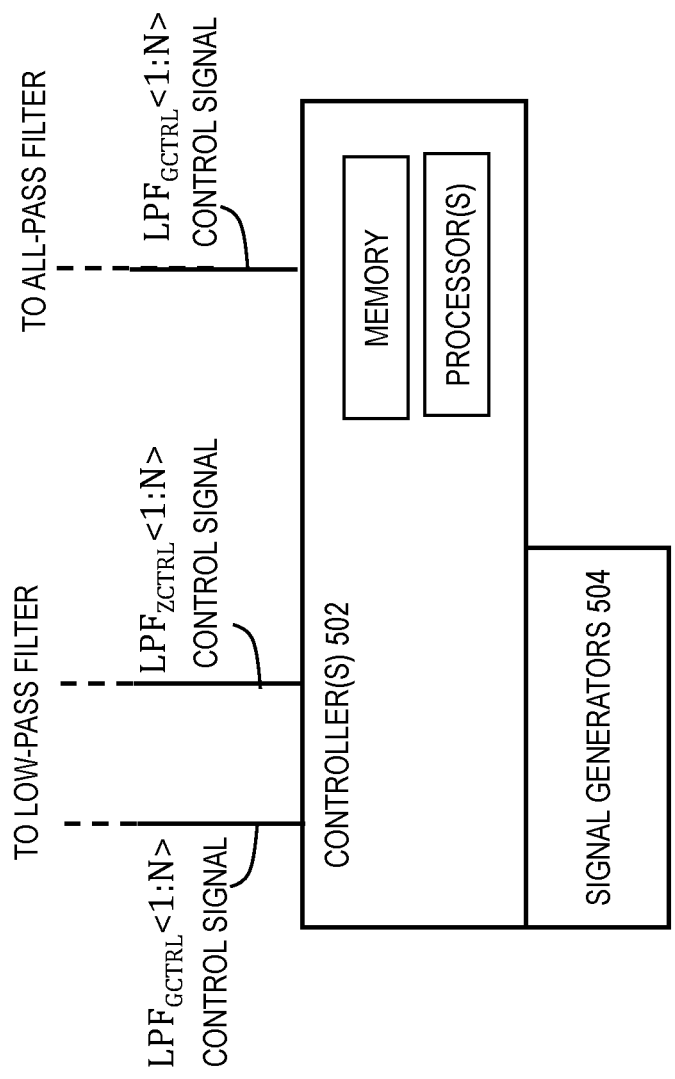
FIG. 5 depicts a block diagram of a controller(s) used to provide control signals to a continuous time linear equalizer/equalization circuit in accordance with one or more embodiments of the present invention.

FIG. 5 is a block diagram of a controller(s) 502 used to provide control signals to all-pass filter 202, 402 and low-pass filter 220 in accordance with one or more embodiments. Controller 502 is configured to provide a control signal $LPF_{GCTRL}<1:N>$ to all-pass filter 202, 402 and provide control signals $LPF_{GCTRL}<1:N>$ and $LPF_{ZCTRL}<1:N>$ to low-pass filter 220. Controller 502 is coupled to one or more signal generators 504 and is configured to control and/or cause the generation of respective control signals for $LPF_{GCTRL}<1:N>$ and $LPF_{ZCTRL}<1:N>$, as discussed herein. Controller 502 may be coupled to and control any suitable equipment for generating control signals discussed herein.

Controller 502 can be implemented as one or more software applications and/or modules. Modules can be implemented as instructions stored on a computer-readable storage medium, as hardware modules, as special-purpose hardware (e.g., application specific hardware, application specific integrated circuits (ASICs), as embedded controllers, hardwired circuitry, etc.), and/or as some combination or combinations of these. In examples, modules described herein can be a combination of hardware and programming. The programming can be processor executable instructions stored on a tangible memory, and the hardware can include processing circuitry (e.g., processors) for executing those instructions. Thus, a system memory can store program instructions that when executed by processing circuitry implement the modules described herein. Other modules can also be utilized to include other features and functionality described in other examples herein. Alternatively or additionally, modules can include dedicated hardware, such as one or more integrated circuits, application specific integrated circuits (ASICs), application specific special processors (ASSPs), field programmable gate arrays (FPGAs), or any combination of the foregoing examples of dedicated hardware, for performing the techniques described herein.

FIG. 6 is a flowchart of a method 600 for continuous time linear equalization having a low frequency equalization circuit that maintains DC gain in accordance with one or more embodiments. At block 602, an all-pass filter 202 is coupled to an integrated filter (e.g., low-pass filter 220), the integrated filter having a low-pass filter and another all-pass filter. At block 604, a high-pass filter 240 is coupled to the all-pass filter 202 and the integrated filter (e.g., low-pass filter 220), a differential input terminal (e.g., differential input terminals for Vip and Vin) being coupled to the all-pass filter 202, the integrated filter (e.g., low-pass filter 220), and the high-pass filter 240, wherein a differential output terminal (e.g., differential output terminals for $V_{OUT}$) is coupled to the high-pass filter 240.

In one or more embodiments, the all-pass filter 202 includes a first current source (e.g., current source I1) and a second current source (e.g., current source I2) respectively coupled to a first transistor (e.g., transistor M1) and a second transistor (e.g., transistor M2). The all-pass filter 202 and the integrated filter (e.g., low-pass filter 220) are coupled at a first node (e.g., node A1) and a second node (e.g., node B1), the high-pass filter 240 being coupled to the first node and the second node.

In one or more embodiments, the integrated filter (e.g., low-pass filter 220) includes a first current source (e.g., current source I3) and a second current source (e.g., current source I4) respectively coupled to a first transistor (e.g., transistor M3) and a second transistor (e.g., transistor M4). The integrated filter (e.g., low-pass filter 220) includes: a first set of transistors (e.g., transistors M5 and M7) in which one (e.g., transistor M5) of the first set of transistors is coupled to the first transistor (e.g., transistor M3) and another one (e.g., transistor M7) is coupled to the all-pass filter 202, and a second set of transistors (e.g., transistors M6 and M8) in which one (e.g., transistor M6) of the second set of transistors is coupled to the second transistor (e.g., transistor M4) and another one (e.g. transistor M8) is coupled to the all-pass filter 202.

In one or more embodiments, the all-pass filter and the integrated filter are configured to cause an increase in a magnitude of a low frequency band at the differential output. For example, this is illustrated as low frequency gain 352 in FIG. 3B. The all-pass filter 202 and the integrated filter (e.g., low-pass filter 220) each have resistors (R1, R2 respectively) such that a parallel change in values of the resistors affects a magnitude of a low frequency band at the differential output, the magnitude being shifted in accordance with the parallel change in values of the resistors. The integrated filter (e.g., low-pass filter 220) includes a low-pass filter curve which is configured to have a frequency shift based on a control signal. Low-pass filter curve is depicted in graphical representation 320 in FIG. 3A. The integrated filter comprises a low-pass filter curve which is configured to have a magnitude shift based on a control signal, as seen in FIG. 3A. The all-pass filter 202 includes an all-pass filter curve which is configured to have a magnitude shift based on a control signal, which is depicted in graphical representation 302 in FIG. 3A.

FIG. 7 is a flowchart of a method 700 for continuous time linear equalization having a low frequency equalization circuit that maintains DC gain in accordance with one or more embodiments. At block 702, a first integrated filter circuit (e.g., low-pass filter 220) is configured to include a low-pass filter coupled to an all-pass filter. At block 704, a second integrated filter circuit (e.g., high-pass filter 440) is configured to include a high-pass filter coupled to another all-pass filter, the first integrated filter circuit (e.g., low-pass filter 220) being coupled to the second integrated filter circuit (e.g., high-pass filter 440), a differential input terminal (e.g., differential input terminals for Vip and Vin) being coupled to the first integrated filter circuit and the second integrated filter circuit, wherein a differential output terminal (e.g., differential output terminals $V_{OUT}$) is coupled to the second integrated filter circuit.

Figure 8B:
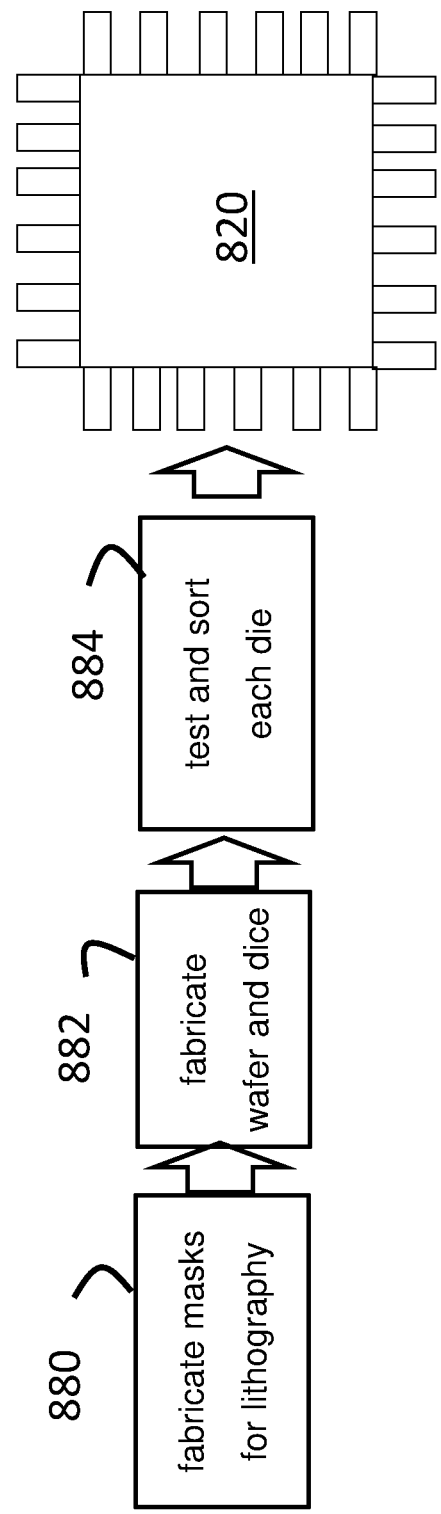
FIG. 8B is a process flow of a method of fabricating the integrated circuit according to one or more embodiments of the present invention.

FIG. 8A is a block diagram of a system 800 to form an integrated circuit the continuous time linear equalization circuit (e.g., circuits 200, 400) according to one or more embodiments of the invention. The system 800 includes processing circuitry 810 used to generate the design 840 that is ultimately fabricated into an integrated circuit 820. The steps involved in the fabrication of the integrated circuit 820 are well-known and briefly described herein. Once the physical layout is finalized, based, in part, on the continuous time linear equalization circuit (e.g., circuits 200, 400) according to embodiments of the invention to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 8B.

FIG. 8B is a process flow of a method of fabricating the integrated circuit according to one or more embodiments of the invention. Once the physical design data is obtained, based, in part, on the continuous time linear equalization circuit (e.g., circuits 200, 400), the integrated circuit 820 can be fabricated according to known processes that are generally described with reference to FIG. 8B. Generally, a wafer with multiple copies of the final design is fabricated and cut (i.e., diced) such that each die is one copy of the integrated circuit 820. At block 880, the processes include fabricating masks for lithography based on the finalized physical layout. At block 882, fabricating the wafer includes using the masks to perform photolithography and etching. Once the wafer is diced, testing and sorting of each die is performed, at block 884, to filter out any faulty die.

For the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/ connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
    coupling a first all-pass filter to an integrated filter, the integrated filter comprising a low-pass filter and a second all-pass filter; and
    coupling a high-pass filter to the first all-pass filter and the integrated filter, the first all-pass filter, the integrated filter, and the high-pass filter being coupled to a differential input terminal, wherein a differential output terminal is coupled to the high-pass filter.

2. The method of claim 1, wherein the first all-pass filter comprises a first current source and a second current source respectively coupled to a first transistor and a second transistor.

3. The method of claim 1, wherein the first all-pass filter and the integrated filter are coupled at a first node and a second node, the high-pass filter being coupled to the first node and the second node.

4. The method of claim 1, wherein the integrated filter comprises a first current source and a second current source respectively coupled to a first transistor and a second transistor.

5. The method of claim 4, wherein the integrated filter comprises: a first set of transistors in which one of the first set of transistors is coupled to the first transistor and another one is coupled to the first all-pass filter, and a second set of transistors in which one of the second set of transistors is coupled to the second transistor and another one is coupled to the first all-pass filter.

6. The method of claim 1, wherein the first all-pass filter and the integrated filter are configured to cause an increase in a magnitude of a low frequency band at the differential output terminal.

7. The method of claim 1, wherein the first all-pass filter and the integrated filter each have resistors such that a parallel change in values of the resistors affects a magnitude of a low frequency band at the differential output terminal, the magnitude being shifted in accordance with the parallel change in values of the resistors.

8. The method of claim 1, wherein the integrated filter comprises a low-pass filter curve which is configured to have a frequency shift based on a control signal.

9. The method of claim 1, wherein the integrated filter comprises a low-pass filter curve which is configured to have a magnitude shift based on a control signal.

10. The method of claim 1, wherein the first all-pass filter comprises an all-pass filter curve which is configured to have a magnitude shift based on a control signal.

11. A circuit comprising:
    a first all-pass filter coupled to an integrated filter, the integrated filter comprising a low-pass filter and a second all-pass filter; and
    a high-pass filter coupled to the first all-pass filter and the integrated filter, the first all-pass filter, the integrated filter, and the high-pass filter being coupled to a differential input terminal, wherein a differential output terminal is coupled to the high-pass filter.

12. The circuit of claim 11, wherein the first all-pass filter comprises a first current source and a second current source respectively coupled to a first transistor and a second transistor.

13. The circuit of claim 11, wherein the first all-pass filter and the integrated filter are coupled at a first node and a second node, the high-pass filter being coupled to the first node and the second node.

14. The circuit of claim 11, wherein the integrated filter comprises a first current source and a second current source respectively coupled to a first transistor and a second transistor.

15. The circuit of claim 14, wherein the integrated filter comprises: a first set of transistors in which one of the first set of transistors is coupled to the first transistor and another one is coupled to the first all-pass filter, and a second set of transistors in which one of the second set of transistors is coupled to the second transistor and another one is coupled to the first all-pass filter.

16. The circuit of claim 11, wherein the first all-pass filter and the integrated filter are configured to cause an increase in a magnitude of a low frequency band at the differential output terminal.

17. The circuit of claim 11, wherein the first all-pass filter and the integrated filter each have resistors such that a parallel change in values of the resistors affects a magnitude of a low frequency band at the differential output terminal, the magnitude being shifted in accordance with the parallel change in values of the resistors.

18. The circuit of claim 11, wherein the integrated filter comprises a low-pass filter curve which is configured to have a frequency shift based on a control signal.

19. The circuit of claim 11, wherein the integrated filter comprises a low-pass filter curve which is configured to have a magnitude shift based on a control signal.

20. A method comprising:
    configuring a first integrated filter circuit comprising a low-pass filter coupled to a first all-pass filter; and configuring a second integrated filter circuit comprising a high-pass filter coupled to a second all-pass filter, the first integrated filter circuit being coupled to the second integrated filter circuit, the first integrated filter circuit and the second integrated filter circuit being coupled to a differential input terminal, wherein a differential output terminal is coupled to the second integrated filter circuit.

* * * * *